US011129315B2

United States Patent
Ito et al.

(10) Patent No.: US 11,129,315 B2
(45) Date of Patent: Sep. 21, 2021

(54) COMPONENT MOUNTER

(71) Applicant: FUJI CORPORATION, Chiryu (JP)

(72) Inventors: Hidetoshi Ito, Okazaki (JP); Kenzo Ishikawa, Kariya (JP)

(73) Assignee: FUJI CORPORATION, Chiryu (JP)

( * ) Notice: Subject to any disclaimer, the term of this patent is extended or adjusted under 35 U.S.C. 154(b) by 188 days.

(21) Appl. No.: 16/495,518

(22) PCT Filed: Mar. 28, 2017

(86) PCT No.: PCT/JP2017/012559
§ 371 (c)(1),
(2) Date: Sep. 19, 2019

(87) PCT Pub. No.: WO2018/179076
PCT Pub. Date: Oct. 4, 2018

(65) Prior Publication Data
US 2020/0100406 A1    Mar. 26, 2020

(51) Int. Cl.
*H05K 13/04*    (2006.01)
*H05K 13/00*    (2006.01)

(52) U.S. Cl.
CPC ..... *H05K 13/0411* (2018.08); *H05K 13/0061* (2013.01); *H05K 13/0406* (2018.08); *H05K 13/0409* (2018.08)

(58) Field of Classification Search
CPC .......... H95K 13/0061; H95K 13/0406; H95K 13/0409; H95K 13/0411
See application file for complete search history.

(56) References Cited

U.S. PATENT DOCUMENTS 5,377,405 A   *   1/1995   Sakurai ................ H05K 13/041
                                                                   29/833
5,579,572 A   *   12/1996   Kashiwagi ........... H05K 13/041
                                                                   29/836

(Continued)

FOREIGN PATENT DOCUMENTS

EP        2 760 264 A1       7/2014
EP        2 966 951 B1     11/2017

(Continued)

OTHER PUBLICATIONS

International Search Report dated Jun. 27, 2017 in PCT/JP2017/012559 filed on Mar. 28, 2017.

*Primary Examiner* — Carl J Arbes
(74) *Attorney, Agent, or Firm* — Oblon, McClelland, Maier & Neustadt, L.L.P.

(57) ABSTRACT

A component mounter of the present disclosure including a mounting head configured to pick up components and mount the components onto a substrate; a head moving device configured to move the mounting head in parallel to a horizontal plane; and a conveyance device configured to convey the substrate in a conveyance direction parallel to the horizontal plane. The mounting head includes multiple nozzles configured to pick up and hold the components by a negative pressure, multiple switching valves provided corresponding to each of the multiple nozzles and configured to switch whether the negative pressure is supplied to the corresponding nozzle, a nozzle moving device configured to change which nozzle is positioned at each of a first nozzle position and a second nozzle position for moving the multiple nozzles and performing at least one of picking up and mounting of the components, a first driving device, and a second driving device.

6 Claims, 8 Drawing Sheets

(56) References Cited

U.S. PATENT DOCUMENTS

| | | | |
|---|---|---|---|
| 6,085,893 A | 7/2000 | Asai et al. | |
| 7,032,303 B2* | 4/2006 | Kawada | H05K 13/0452 29/832 |
| 2005/0115063 A1* | 6/2005 | Saito | H05K 13/0409 29/743 |
| 2015/0040384 A1* | 2/2015 | Nishiyama | H05K 13/0853 29/739 |
| 2016/0249497 A1 | 8/2016 | Ito et al. | |

FOREIGN PATENT DOCUMENTS

| | | | |
|---|---|---|---|
| JP | 02099000 A * | 4/1990 | |
| JP | 2194700 A * | 8/1990 | |
| JP | 10-163692 A | 6/1998 | |
| WO | WO 2014/136231 A1 | 9/2014 | |
| WO | WO 2015/063934 A1 | 5/2015 | |

* cited by examiner

COMPONENT MOUNTER

TECHNICAL FIELD

The present disclosure relates to a component mounter.

BACKGROUND ART

Conventionally, there has been known a component mounter configured to pick up and mount components on substrates, such as boards (for example, Patent Literature 1). The component mounter described in Patent Literature 1 includes a mounting head and an XY robot that moves a mounting head to any position within the horizontal plane. The mounting head includes multiple component suction nozzles configured to pick up components by negative pressure, a pressure switching valve for switching the pressure in the component suction nozzles between a negative pressure and a pressure equal to or higher than atmospheric pressure, a moving member for switching a pressure switching valve, and a linear motor as a driving source for moving the moving member.

PATENT LITERATURE

Patent Literature 1: JP-A-10-163692

BRIEF SUMMARY

Technical Problem

Incidentally, in such a component mounter, the nozzle is moved to a necessary position by moving the mounting head. Therefore, it is necessary to have a moving space for the mounting head larger than the region in which the nozzle is moved. Accordingly, the larger the mounting head is, the larger the component mounter tends to be. In view of the above, it is preferable that the mounting head is small.

The present disclosure has been made in order to solve the above-described problem, and a main object thereof is to enable reduction of the size of a mounting head.

Solution to Problem

The present disclosure employs the following means in order to achieve the above-described main object.

According to the present disclosure, there is provided a first component mounter including: a mounting head configured to pick up components and mount the components onto a substrate, a head moving device configured to move the mounting head in parallel to a horizontal plane, and a conveyance device configured to convey the substrate in a conveyance direction parallel to the horizontal plane; in which the mounting head includes multiple nozzles configured to pick up and hold the components by a negative pressure, multiple switching valves provided corresponding to each of the multiple nozzles and configured to switch whether the negative pressure is supplied to the corresponding nozzle, a nozzle moving device configured to change which nozzle is positioned at each of a first nozzle position and a second nozzle position for moving the multiple nozzles and performing at least one of picking up components and mounting components, a first driving device having a first driving source and configured to switch the switching valve that corresponds to the nozzle positioned at the first nozzle position by a driving force from the first driving source, and a second driving device having a second driving source disposed on a side opposite to the first driving source when viewed from the multiple nozzles in a direction parallel to the horizontal plane and orthogonal to the conveyance direction and configured to switch the switching valve that corresponds to the nozzle positioned at the second nozzle position by a driving force from the second driving source.

In the first component mounter, the first driving source and the second driving source are disposed on the sides opposite to each other so as to sandwich the multiple nozzles along the direction parallel to the horizontal plane and orthogonal to the conveyance direction of the substrate. Therefore, in the first component mounter, for example, compared to a case where the first driving source and the second driving source are disposed on the same side when viewed from the multiple nozzles, it is possible to reduce the size of the mounting head. Here, "parallel to the horizontal plane" includes a case of being substantially parallel.

DESCRIPTION OF EMBODIMENTS

Figure 1:
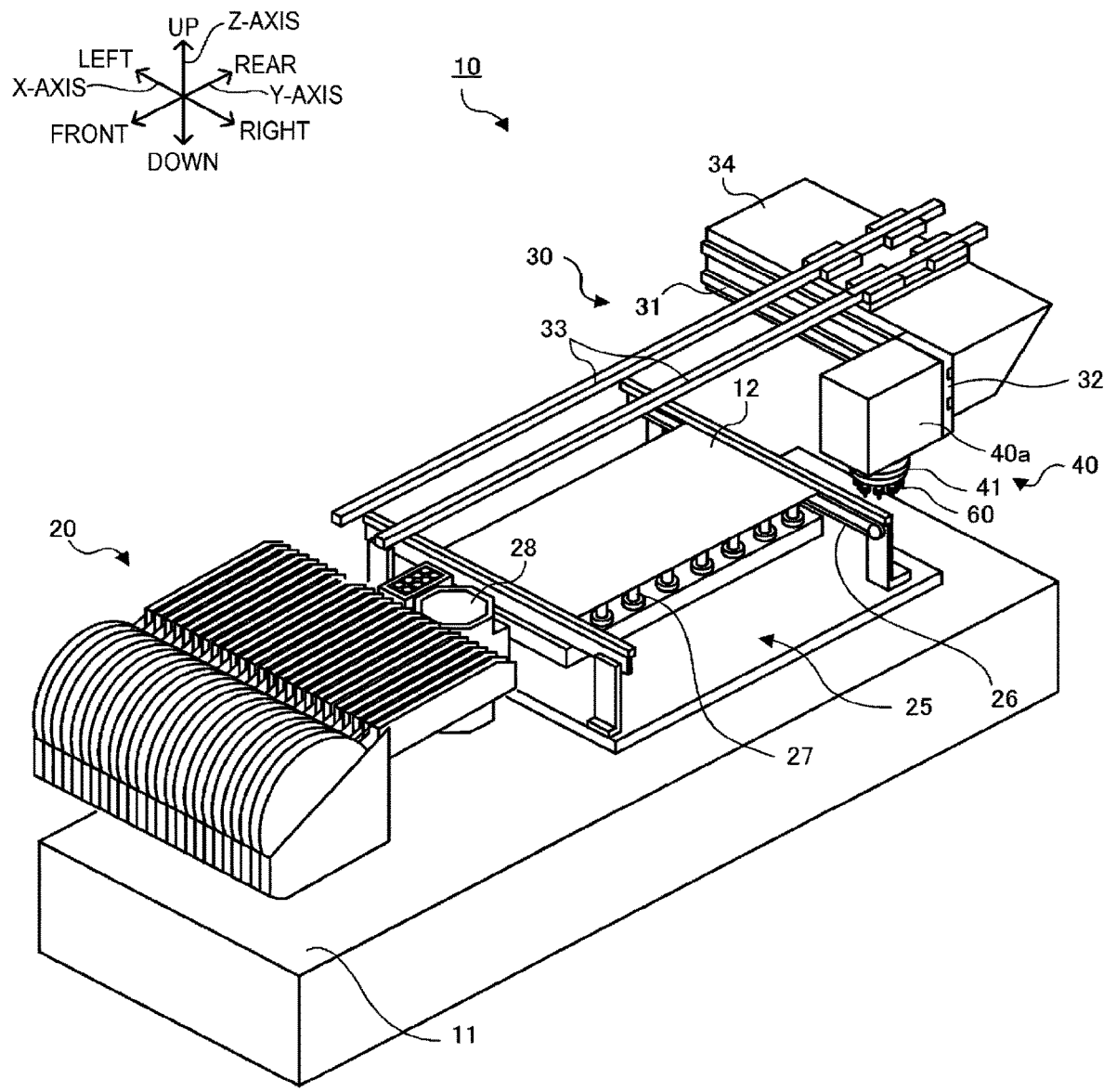
FIG. 1 is a perspective view illustrating a schematic configuration of component mounter 10.
Figure 2:
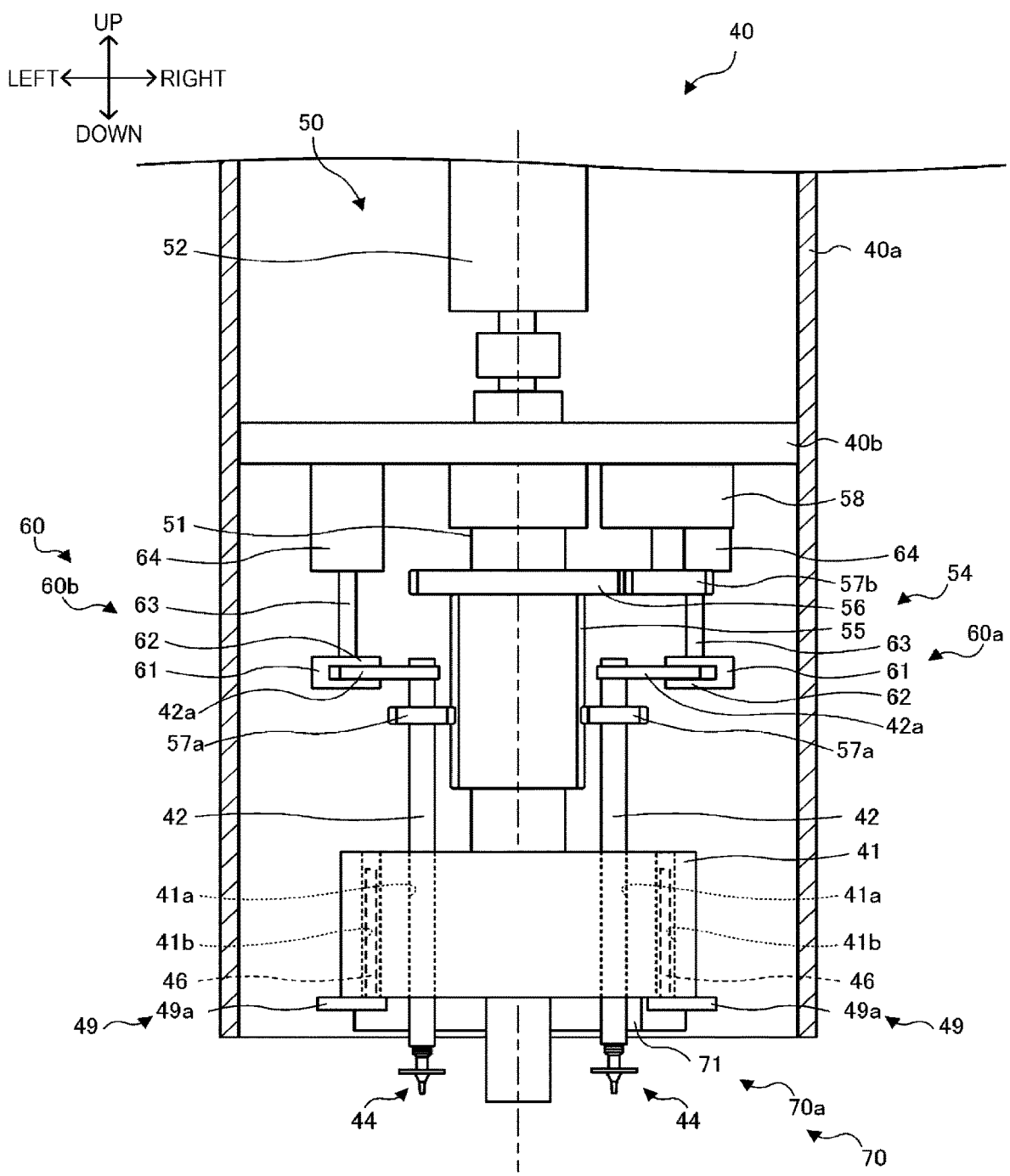
FIG. 2 is a diagram illustrating a schematic configuration of mounting head 40.
Figure 3:
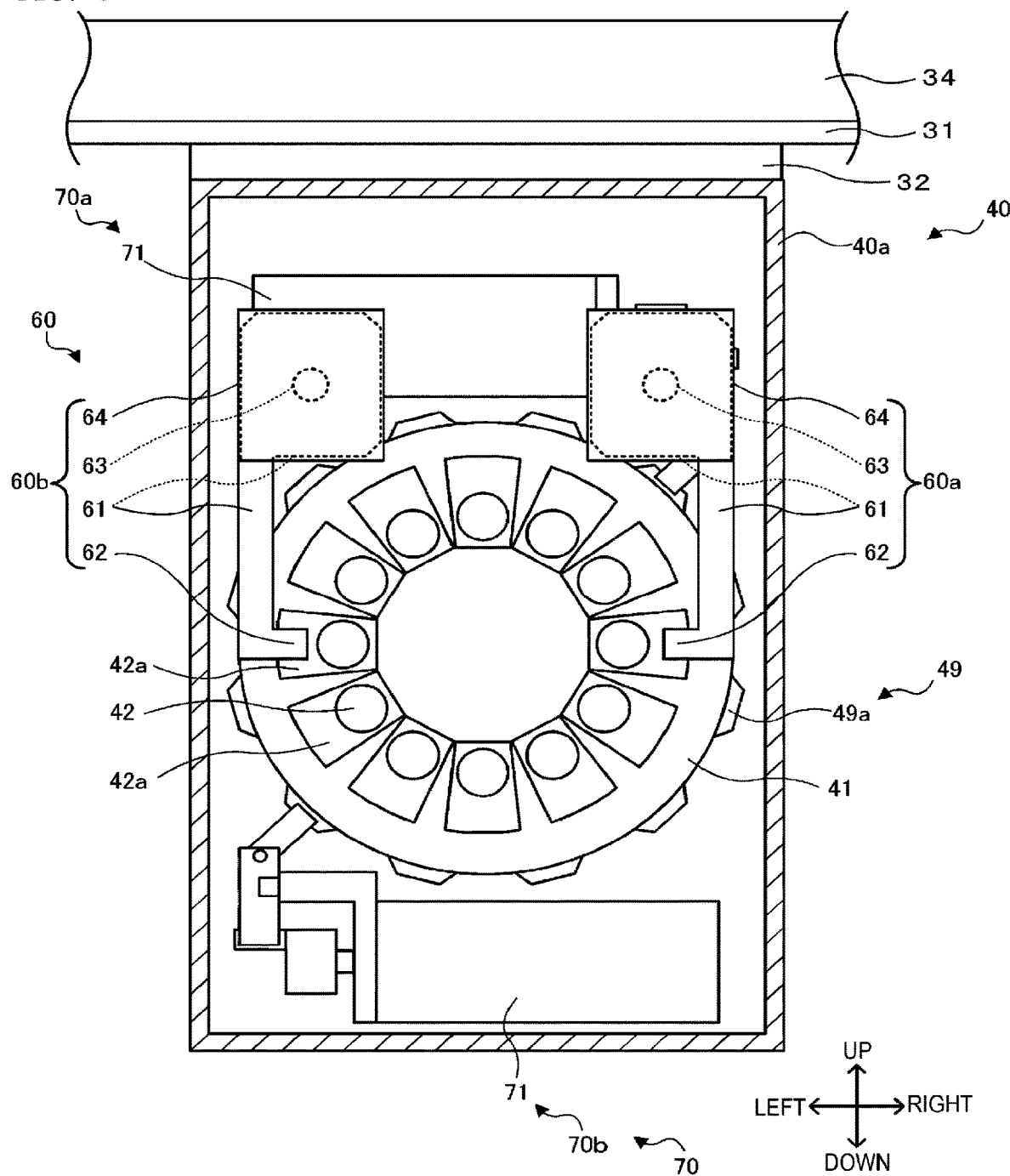
FIG. 3 is a top view illustrating an arrangement of Z-axis driving device 60.
Figure 4:
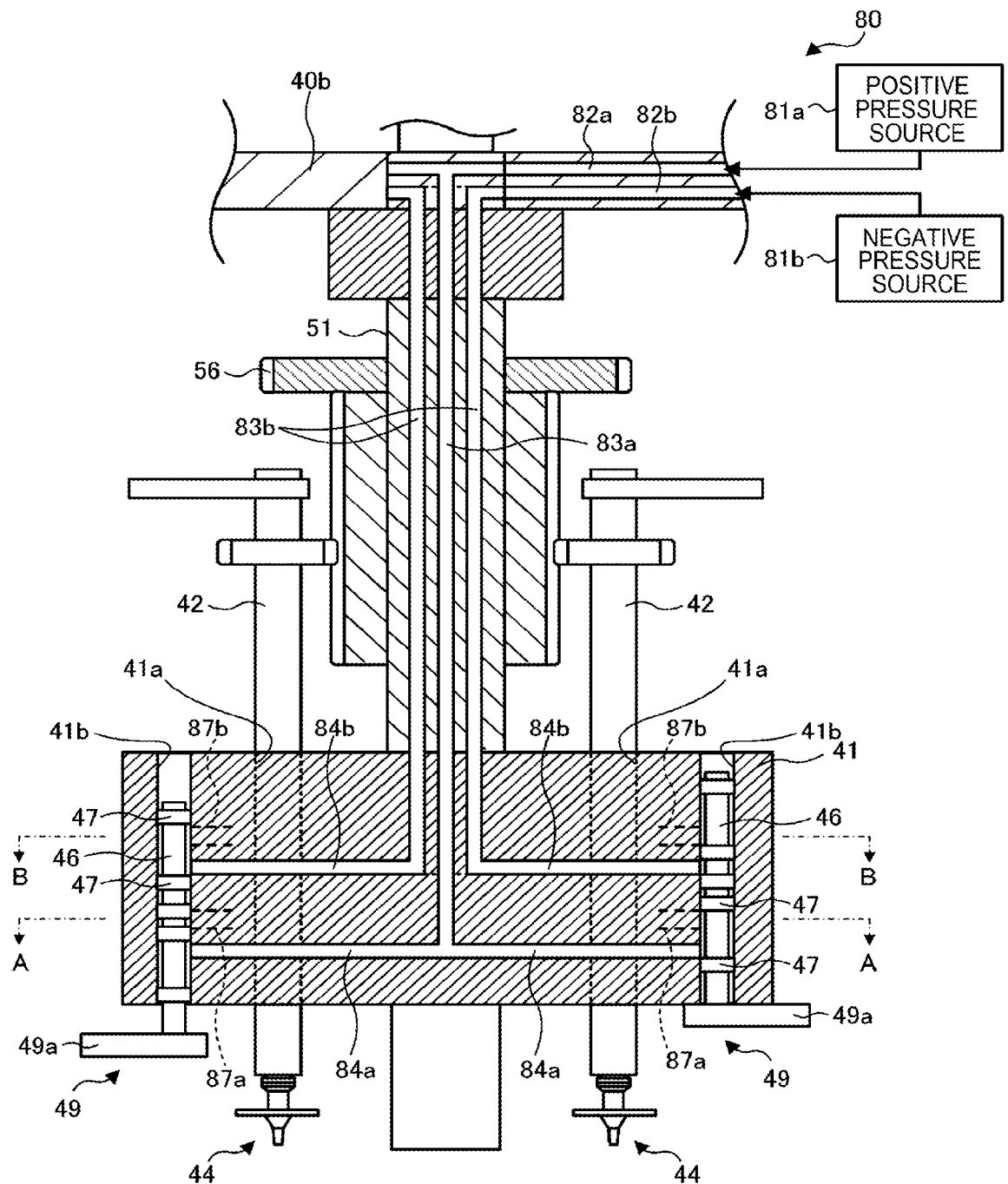
FIG. 4 is a diagram illustrating a schematic configuration of pressure supply device 80.
Figure 5:
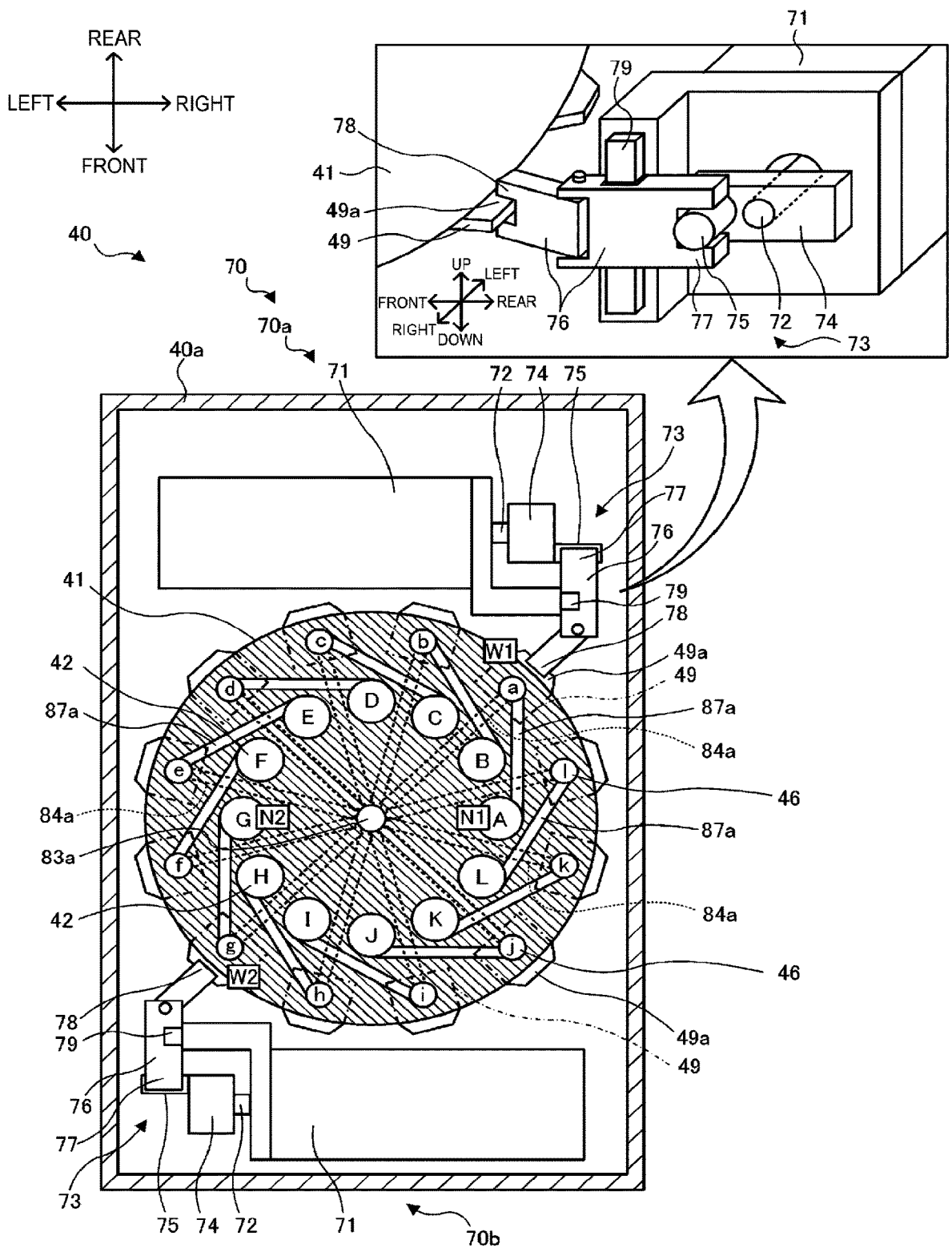
FIG. 5 is a diagram illustrating a positional relationship of nozzle holder 42, spool valve 46, and valve driving device 70.
Figure 6:
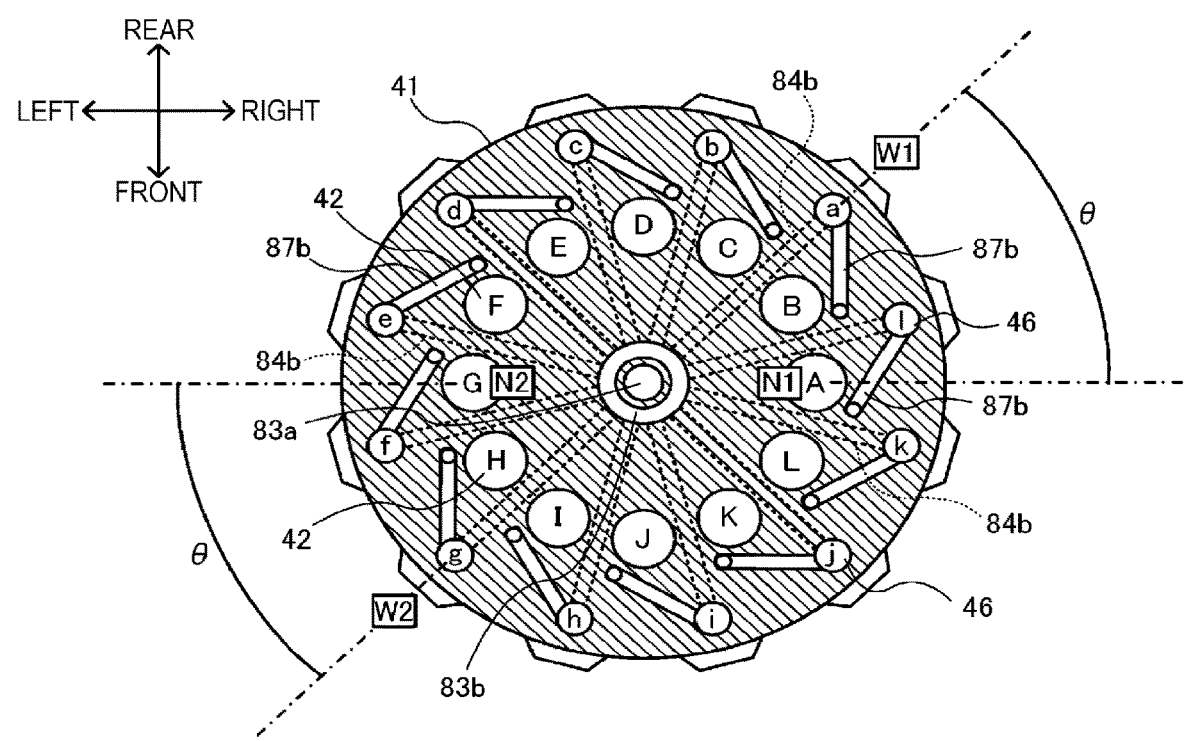
FIG. 6 is a sectional view taken along line B-B of FIG. 4.
Figure 7A:
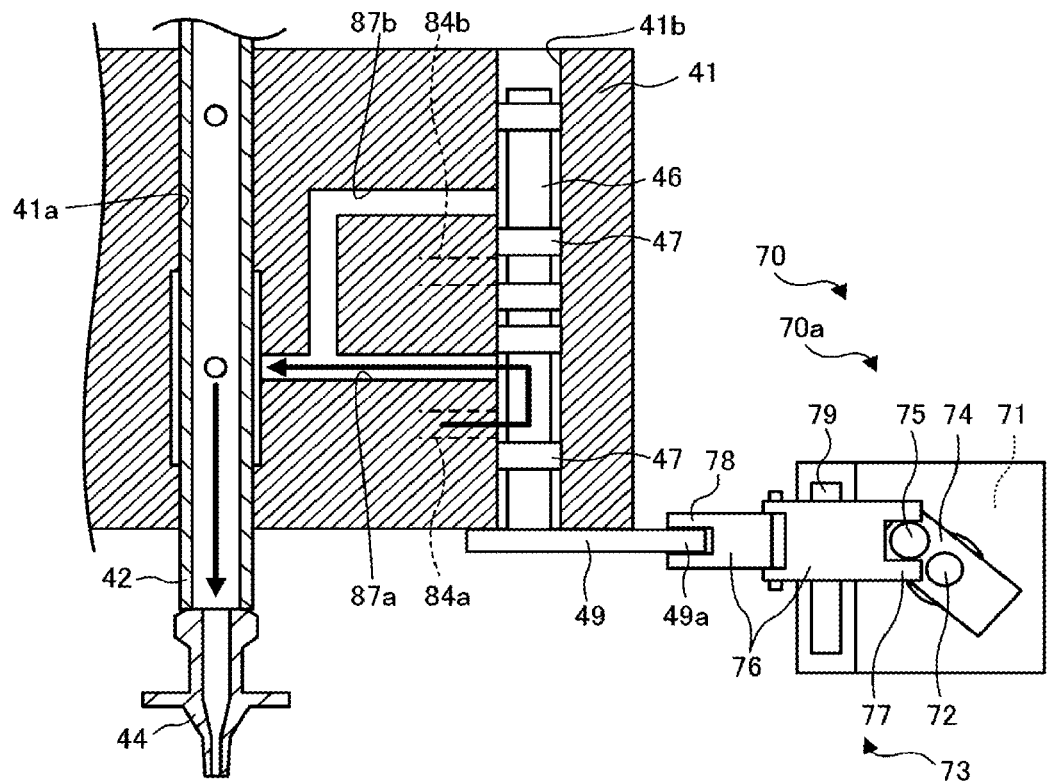
FIG. 7 is a diagram illustrating an instance in which valve driving device 70 switches spool valve 46.
Figure 7B:
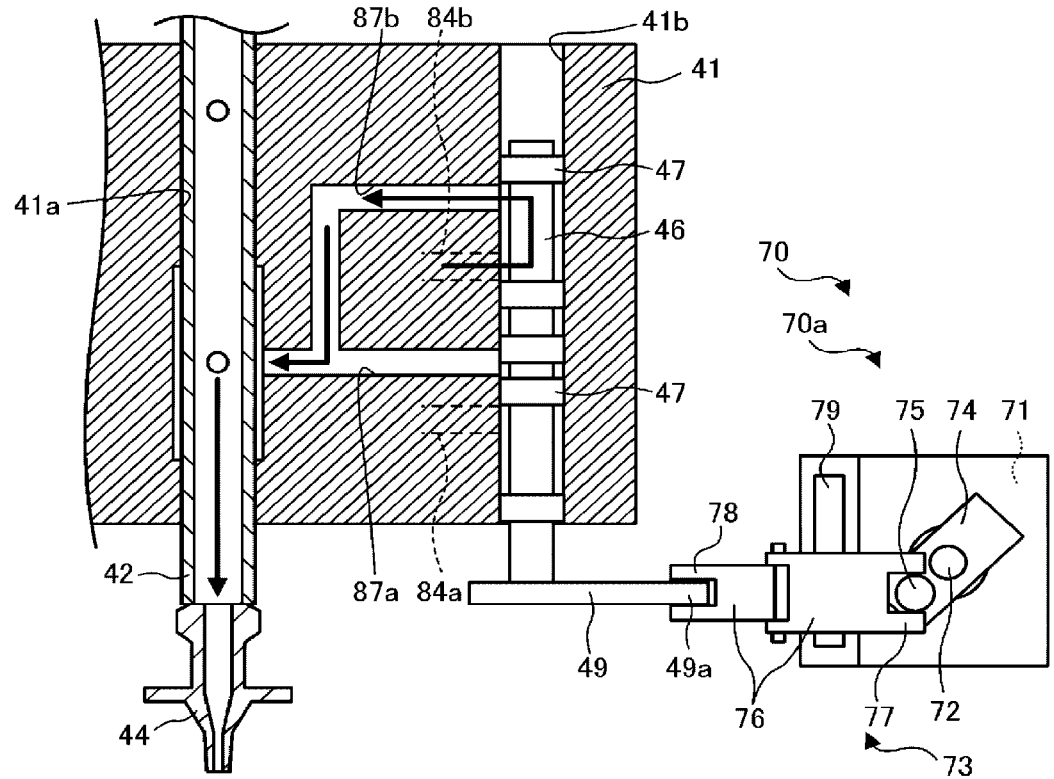
Figure 8:
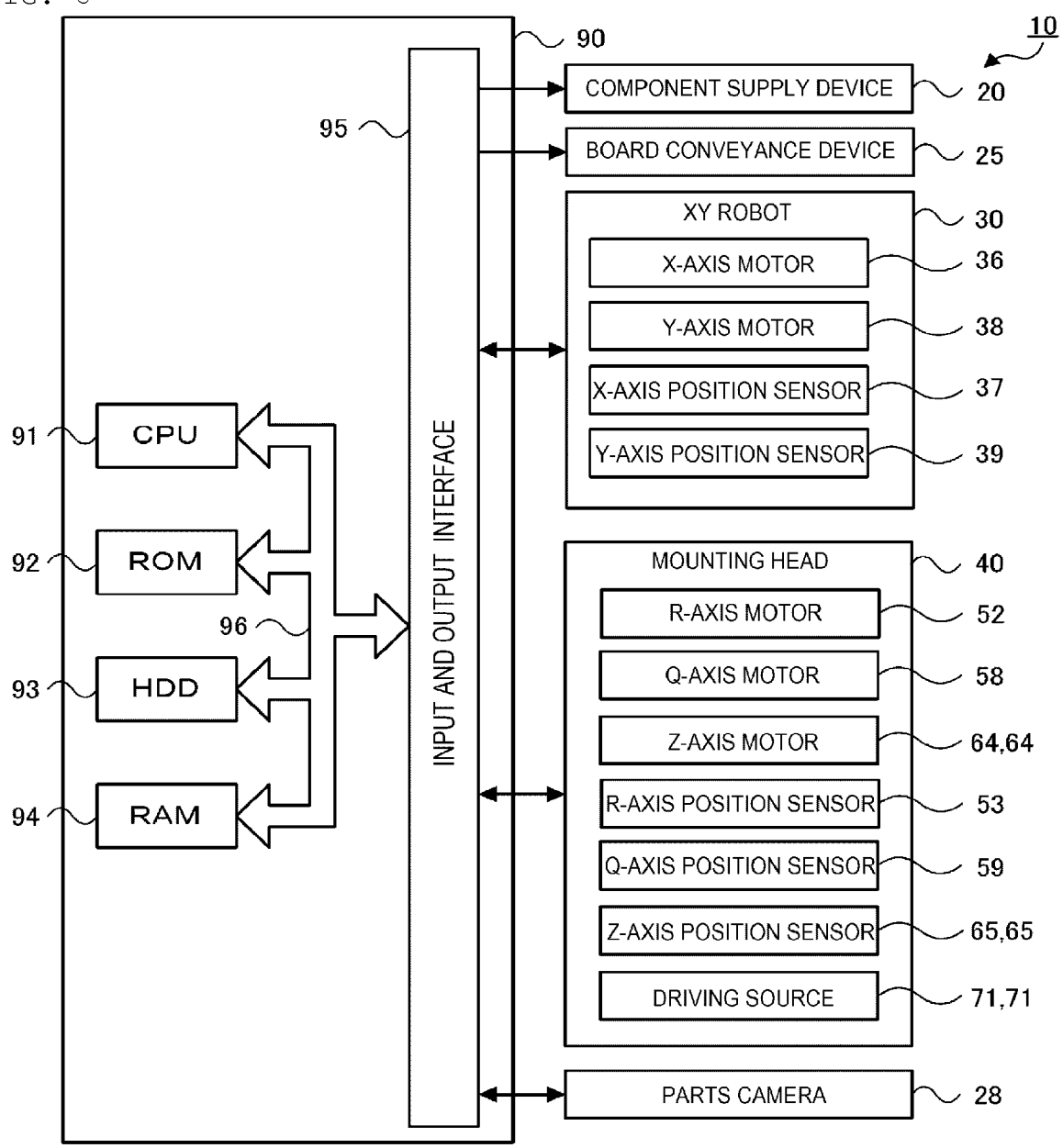
FIG. 8 is a diagram illustrating electrical connections of component mounter 10.

Embodiments of the component mounter of the present disclosure will be described below with reference to the drawings. FIG. 1 is a perspective view illustrating a schematic configuration of component mounter 10, FIG. 2 is a diagram illustrating a schematic configuration of mounting head 40, FIG. 3 is a top view illustrating an arrangement of Z-axis driving device 60, and FIG. 4 is a diagram illustrating a schematic configuration of pressure supply device 80. In addition, FIG. 5 is a diagram illustrating a positional relationship of nozzle holder 42, spool valve 46, and valve driving device 70, FIG. 6 is a sectional view taken along line B-B of FIG. 4, FIG. 7 is a diagram illustrating an instance in which valve driving device 70 switches spool valve 46, and FIG. 8 is a diagram illustrating electrical connections of component mounter 10. A sectional view of head main body 41 in FIG. 5 is a sectional view taken along line A-A of FIG. 4. In addition, the left-right direction of FIG. 1 is the X-axis direction, the front-rear (near-far) direction is the Y-axis direction, and the up-down direction is the Z-axis direction.

Component mounter 10 is a device that mounts components on board 12, which is an example of a substrate. As illustrated in FIG. 1, component mounter 10 includes base 11, component supply device 20, board conveyance device 25, XY robot 30, mounting head 40, parts camera 28, and control device 90 (refer to FIG. 8).

Multiple component supply devices 20 are provided to be arranged in an arrangement direction parallel to the horizontal plane (XY-plane). In the present embodiment, component supply device 20 is disposed on the front side of component mounter 10, and the arrangement direction of component supply device 20 is the left-right direction (X-axis direction). Each of multiple component supply devices 20 is configured as a tape feeder for supplying component P by feeding a tape in which components P are accommodated in accommodation sections formed at predetermined intervals.

Board conveyance device 25 is a device for conveying board 12 in a conveyance direction parallel to the horizontal plane (XY-plane). In the present embodiment, the conveyance direction is the left-right direction (X-axis direction). As illustrated in FIG. 1, board conveyance device 25 includes a pair of conveyor belts 26 and 26 (only one is illustrated in FIG. 1) provided in the front-rear direction at an interval and mounted across in the left-right direction. When board 12 is conveyed in the conveyance direction by conveyor belts 26 and 26 and reaches a predetermined acquisition position, board 12 is supported by multiple support pins 27 provided on the rear face side.

XY robot 30 is a device that moves mounting head 40 parallel to the horizontal plane (XY-plane). As illustrated in FIG. 1, XY robot 30 includes a pair of left and right Y-axis guide rails 33 and 33 provided along the front-rear direction (Y-axis direction), and Y-axis slider 34 on which the pair of left and right Y-axis guide rails 33 and 33 are mounted across. In addition, XY robot 30 includes X-axis guide rails 31 and 31 provided on the front face of Y-axis slider 34 along the left-right direction (X-axis direction) and X-axis slider 32 attached to X-axis guide rails 31 and 31. X-axis slider 32 is movable in the X-axis direction by the drive of X-axis motor 36 (refer to FIG. 8), and Y-axis slider 34 is movable in the Y-axis direction by the drive of Y-axis motor 38 (refer to FIG. 8). Mounting head 40 is attached to X-axis slider 32. Mounting head 40 is moved to any position on the XY-plane by the movement of XY robot 30.

Mounting head 40 is a device for picking up components and mounting the components onto board 12. As illustrated in FIG. 2, mounting head 40 includes housing 40a, frame 40b, head main body 41, nozzle holder 42, nozzle 44, and spool valve 46. In addition, mounting head 40 includes R-axis driving device 50, Q-axis driving device 54, Z-axis driving device 60, valve driving device 70, and pressure supply device 80. Housing 40a is an exterior of mounting head 40, and has a substantially rectangular parallelepiped shape. In housing 40a, three sides of the rectangular parallelepiped are respectively aligned with the XYZ-axis directions. X-axis slider 32 is attached to the rear side of housing 40a (refer to FIG. 3). In addition, housing 40a may be partially (for example, a lower surface) open and may not completely cover the structure on the inside of mounting head 40. Frame 40b is disposed in housing 40a.

Head main body 41 is a columnar rotating body. Multiple holder holes 41a and multiple spool holes 41b are formed in head main body 41. As illustrated in FIGS. 3 and 5, multiple nozzle holders 42 are provided at predetermined intervals along a circumferential direction of head main body 41, and are disposed on the circumference. Accordingly, mounting head 40 is configured as a rotary head. Each of multiple nozzle holders 42 penetrates holder holes 41a and is attached to head main body 41 so as to be vertically movable. Nozzles 44 are exchangeably attached to distal end portions of each of nozzle holders 42. Each nozzle 44 is attached to head main body 41 via nozzle holder 42 and is disposed on the circumference along the circumferential direction of head main body 41. Nozzle 44 picks up and holds the component at the distal end by the action of negative pressure supplied from pressure supply device 80. The center of the circumference on which nozzle holder 42 and nozzle 44 are disposed matches the center of head main body 41. In the present embodiment, head main body 41 has twelve nozzle holders 42 to which twelve nozzles 44 are respectively attached. Therefore, nozzle holders 42 adjacent to each other are disposed at intervals of 30° along the circumferential direction of head main body 41. The same applies to nozzle 44. Reference numerals A to L illustrated in FIGS. 5 and 6 indicate identification marks of each of twelve nozzle holders 42, and nozzle holders 42 are respectively referred to as A to L holders in the counterclockwise direction from nozzle holder 42 that is at a position of 3 o'clock in the drawings. Similarly, nozzles 44 attached to each of the A to L holders are referred to as A to L nozzles, respectively.

Multiple spool valves 46 are disposed in head main body 41 and are provided so as to correspond to each of multiple spool valves 46 and nozzles 44. Spool valve 46 is a switching valve for switching whether the negative pressure from pressure supply device 80 is supplied to corresponding nozzle 44. In the present embodiment, spool valve 46 switches whether the negative pressure from pressure supply device 80 is supplied to nozzle 44. As illustrated in FIGS. 5 and 6, multiple spool valves 46 are provided at predetermined intervals along the circumferential direction of head main body 41 and are disposed on the circumference. Each of multiple spool valves 46 is inserted into spool holes 41b and attached to head main body 41 so as to be vertically movable. As illustrated in FIGS. 4 and 7, each of the multiple spool valves 46 includes a main body section having a columnar shape and a diameter smaller than the inner diameter of spool hole 41b, and multiple (five in the present embodiment) large diameter sections 47 having a diameter larger than that of the main body section and defining a space in spool hole 41b. In the present embodiment, twelve spool valves 46 (the same number as the number of nozzles 44) are attached to head main body 41. Therefore, spool valves 46 adjacent to each other are disposed at intervals of 30° along the circumferential direction of head main body 41. Reference numerals a to l illustrated in FIGS. 5 and 6 are the identification marks of each of spool valves 46, and twelve spool valves 46 are respectively referred to as a to l valves in the counterclockwise direction from spool valve 46 that is at a position of the time of one thirty in the drawings. The a to l valves respectively correspond to the A to L nozzles, and switch the presence or absence of negative pressure supplied to the corresponding nozzles. As can be seen from FIGS. 5 and 6, each of multiple spool valves 46 is disposed at a position circumferentially deviated from the radial direction of head main body 41 which goes through the corresponding nozzle 44. For example, the a valve is disposed (left-right direction of FIG. 5) at a position deviated counterclockwise in the circumferential direction by an angle θ from the radial direction, in the head main body 41 circumference, which goes through the A nozzle. Each of the b to l valves is also respectively disposed at positions deviated by the angle θ from the radial direction that goes through the corresponding B to L nozzles. In the present embodiment, the angle θ is 45°. As described above, since the interval (nozzle pitch) between nozzle holders 42 adjacent to each other is 30°, 45° corresponds to 1.5 nozzle pitches.

In addition, each of multiple spool valves 46 has operation lever 49 at the lower end (refer to FIGS. 2 and 4). Operation lever 49 is a member on a flat plate. Operation lever 49 has operated section 49a operated by receiving a driving force from valve driving device 70, at a distal end thereof. As illustrated in FIG. 5, operated section 49a is a part of operation lever 49 that protrudes outward from head main body 41 when viewed from above. With operated section 49a receiving the driving force from valve driving device 70, spool valve 46 vertically moves and switches the supply of negative pressure to nozzle 44 on or off. Multiple operated sections 49a are disposed on the circumference concentric to head main body 41 and multiple nozzle holders 42. Each of multiple operated sections 49a is positioned on the outer side in the radial direction of head main body 41 with respect to attached spool valve 46. In other words, operated section 49a is not deviated from spool valve 46 in the radial direction of head main body 41, and is disposed along the radial direction. Therefore, similarly to the a to l valves, each of operated sections 49a of the a to l valves is disposed at a position deviated by the angle θ from the radial directions of the corresponding A to L nozzles.

R-axis driving device 50 is a nozzle moving device for moving multiple nozzles 44. R-axis driving device 50 includes R-axis 51, R-axis motor 52, and R-axis position sensor 53 (refer to FIG. 8). R-axis 51 extends in the up-down direction, and the lower end thereof is attached to a central shaft of head main body 41. R-axis 51 is rotatably supported by frame 40b. R-axis motor 52 is disposed above R-axis 51. R-axis position sensor 53 detects the rotational position of R-axis motor 52. In R-axis driving device 50, R-axis motor 52 rotationally drives R-axis 51 to rotate head main body 41. As head main body 41 rotates, multiple nozzle holders 42 and multiple nozzles 44 rotationally move (revolve) in the circumferential direction together with head main body 41. In other words, as R-axis driving device 50 is driven, multiple nozzle holders 42 and multiple nozzles 44 revolve along a revolution trajectory around a rotation axis of head main body 41. In addition, since multiple spool valves 46 are also attached to head main body 41, multiple spool valves 46 also rotationally move (rotate) integrally with multiple nozzle holders 42 by driving of R-axis driving device 50. Further, R-axis driving device 50 can intermittently revolve nozzle 44 by a predetermined angle by intermittently rotating head main body 41 by a predetermined angle (for example, 30° which is one nozzle pitch).

Here, on the revolution trajectory of nozzle 44, first nozzle position N1 and second nozzle position N2 for nozzle 44 to pick up the component from component supply device 20 and mount the component onto board 12 are determined. In the present embodiment, the position (the direction of 3 o'clock) of the A nozzle in FIG. 5 is first nozzle position N1 when viewed from above, and the position (the direction of 9 o'clock) of the G nozzle is second nozzle position N2. First and second nozzle positions N1 and N2 are positioned to oppose each other at the right and left across a center axis of the revolution trajectory of nozzle 44. First and second nozzle positions N1 and N2 are the positions of the right end and the left end on the revolution trajectory of nozzle 44. R-axis driving device 50 changes which of nozzles 44 among the A to L nozzles is positioned at each of first and second nozzle positions N1 and N2 by rotating head main body 41.

In addition, on the revolution trajectory of operated section 49a, first and second operation positions W1 and W2 are determined as positions for operating operated section 49a from valve driving device 70. Each of first and second operation positions W1 and W2 is determined as positions of operated sections 49a that correspond to nozzles 44 positioned at first and second nozzle positions N1 and N2. For example, since the A nozzle is positioned at first nozzle position N1 in FIG. 5, the position of operated section 49a of the valve that corresponds to the A nozzle in this state is first operation position W1. Therefore, the positional relationship between first nozzle position N1 and first operation position W1 is deviated by the angle θ from the radial direction of head main body 41, similarly to the positional relationship between the above-described A to L nozzles and operated sections 49a of the corresponding a to l valves. By rotating head main body 41, R-axis driving device 50 changes which of a to l valves 49a is positioned at each of first and second operation positions W1 and W2. In addition, since R-axis driving device 50 integrally rotates the A to L nozzles and the a to l valves, regardless of which of A to L nozzles 44 are positioned at each of first and second nozzle positions N1 and N2, operated sections 49a of spool valves 46 that correspond to nozzles 44 positioned at first and second nozzle position are positioned at first and second operation positions W1 and W2.

Q-axis driving device 54 is a mechanism for synchronously rotating (revolving) multiple nozzles 44. As illustrated in FIG. 2, Q-axis driving device 54 includes upper and lower Q-axis gears 55 and 56 at two stages, gears 57a and 57b, Q-axis motor 58, and Q-axis position sensor 59 (refer to FIG. 8). R-axis 51 is coaxially inserted through upper and lower Q-axis gears 55 and 56 at two stages, and Q-axis gears 55 and 56 and R-axis 51 are configured to be rotatable relative to each other. Gears 57a are provided at the upper portions of each of nozzle holders 42, and are slidably engaged with Q-axis gear 55 at the lower stage in the up-down direction. Q-axis motor 58 rotationally drives gear 57b engaged with Q-axis gear 56 at the upper stage. Q-axis position sensor 59 detects the rotational position of Q-axis motor 58. By rotationally driving Q-axis gears 55 and 56 by Q-axis motor 58, Q-axis driving device 54 rotates gear 57a engaged with Q-axis gear 55 to rotate each of nozzle holders 42 around the center axis thereof by the same rotation amount (rotation angle) in the same rotational direction. Accordingly, multiple nozzles 44 also rotate in synchronization with each other.

Z-axis driving device 60 is a device for moving (vertically moving) nozzle holder 42 and nozzle 44 in the Z-axis direction. Z-axis driving device 60 is capable of individually raising and lowering nozzle holder 42 positioned at first and second nozzle positions N1 and N2 on the revolution trajectory of nozzle holder 42, and includes first Z-axis driving device 60a for raising and lowering nozzle holder 42 positioned at first nozzle position N1, and second Z-axis driving device 60b for raising and lowering nozzle holder 42 positioned at second nozzle position N2. First and second Z-axis driving devices 60a and 60b are provided so as to oppose each other at the right and left across the center of head main body 41 in the left-right direction. In addition, first and second Z-axis driving devices 60a and 60b are configured to be symmetrical to each other. First Z-axis driving device 60a includes Z-axis moving body 61, Z-axis motor 64, and Z-axis position sensor 65 (refer to FIG. 8). Z-axis moving body 61 is a flat plate-like member, and is attached to ball screw 63 that extends in the up-down direction so as to be capable of being raised and lowered. At a part on the front side of Z-axis moving body 61, gripping section 62, that is disposed in the vicinity of the upper end of nozzle holder 42 and vertically grips engagement piece 42a that extends in the horizontal direction, is disposed. Z-axis motor 64 raises and lowers Z-axis moving body 61 by rotating ball screw 63. Z-axis position sensor 65 detects the position of Z-axis moving body 61 in the up-down direction.

First Z-axis driving device 60a drives Z-axis motor 64 to raise and lower Z-axis moving body 61 along ball screw 63, thereby raising and lowering nozzle holder 42 and nozzle 44 that are integrated with Z-axis moving body 61. Second Z-axis driving device 60b includes Z-axis moving body 61, ball screw 63, and Z-axis motor 64, and since the configurations are the same as those of first Z-axis driving device 60a, the description thereof will be omitted. In addition, when nozzle holders 42 revolve and stop at first and second nozzle positions N1 and N2, engagement pieces 42a of each of nozzle holders 42 are gripped by gripping sections 62 of first and second Z-axis driving devices 60a and 60b. Therefore, each of first and second Z-axis driving devices 60a and 60b raises and lowers nozzle holders 42 and nozzles 44 at first and second nozzle positions N1 and N2. Accordingly, nozzles 44 positioned at first and second nozzle positions N1 and N2 are lowered to pick up the components of component supply device 20 and are lowered to mount the components onto board 12. In addition, when nozzle holders 42 revolve and move from first and second nozzle positions N1 and N2, engagement pieces 42a of nozzle holders 42 come out of gripping sections 62 of first and second Z-axis driving devices 60a and 60b.

In addition, in the present embodiment, both Z-axis motors 64 and 64 of first and second Z-axis driving devices 60a and 60b are disposed to the rear of the center of head main body 41 in the front-rear direction (refer to FIG. 3). Accordingly, both Z-axis motors 64 and 64 are disposed at positions relatively close to X-axis slider 32 in mounting head 40. By doing so, compared to a case where, for example, one or more of Z-axis motors 64 are disposed at the front part of the center of head main body 41, it is possible to bring the center of gravity of mounting head 40 closer to X-axis slider 32 in the rear. Accordingly, it is possible to suppress pitching (rotation around the X-axis) when mounting head 40 is moved in the X-axis direction with X-axis slider 32.

Valve driving device 70 is a device for switching spool valve 46. Valve driving device 70 can individually switch spool valves 46 that correspond to nozzles 44 positioned at first and second nozzle positions N1 and N2. As illustrated in FIG. 5, valve driving device 70 includes first valve driving device 70a for switching spool valve 46 that corresponds to nozzle 44 positioned at first nozzle position N1, and second valve driving device 70b for switching spool valve 46 that corresponds to nozzle 44 positioned at second nozzle position N2. First and second valve driving devices 70a and 70b are provided so as to face each other across head main body 41. In addition, first and second valve driving devices 70a and 70b are disposed to be 2-fold symmetry around the center axis of head main body 41.

First valve driving device 70a includes driving source 71 and driving force transmission mechanism 73. Driving source 71 is configured as a stepping motor, for example, and has drive shaft 72. Driving source 71 has a substantially rectangular parallelepiped shape in which the axial direction (here, the left-right direction) of drive shaft 72 is a longitudinal direction. Driving source 71 is disposed in a direction (here, rearward) orthogonal to the longitudinal direction of driving source 71 and the axial direction of drive shaft 72 when viewed from above, with respect to head main body 41. Driving force transmission mechanism 73 is a mechanism that transmits driving force from driving source 71 to operated section 49a positioned at first operation position W1. Driving force transmission mechanism 73 includes conversion mechanism 74, linear moving section 76, and guide rail 79. Conversion mechanism 74 has a plate-like member, attached to drive shaft 72 such that drive shaft 72 penetrates the center thereof, and columnar protruding section 75 that protrudes to the right from a position of the plate-like member deviated from the rotation axis of drive shaft 72. Conversion mechanism 74 is rotated by a rotational driving force output to drive shaft 72 and converts the rotational movement into a linear movement in the up-down direction of linear moving section 76. Linear moving section 76 is a member that moves linearly based on driving force from driving source 71. Linear moving section 76 is a member that connects multiple (here, two) plate-like members, has protruding engaging section 77 that grips protruding section 75 and is engaged therewith on one end, and has lever engaging section 78 that grips operated section 49a positioned at first operation position W1 and is engaged therewith on the other end. Among the plate-like members that configure linear moving section 76, the plate-like member including protruding engaging section 77 is disposed in a direction along the front-rear direction, and the plate-like member including lever engaging section 78 is disposed in a direction along the radial direction of head main body 41. Guide rail 79 is provided along the up-down direction and is attached to a member provided on the right side of driving source 71. Linear moving section 76 is attached to the right side of guide rail 79 so as to be vertically movable, and guide rail 79 supports linear moving section 76 while allowing the linear movement of linear moving section 76 in the up-down direction.

In first valve driving device 70a, when driving source 71 outputs the driving force, conversion mechanism 74 rotates together with drive shaft 72, and linear moving section 76 engaged with protruding section 75 moves vertically and linearly. Due to the linear movement, protruding engaging section 77 of linear moving section 76 vertically moves operated section 49a positioned at first operation position W1. As operated section 49a vertically moves, spool valve 46 also vertically moves, and the state of spool valve 46 is switched. FIG. 7A is a view illustrating a state where first valve driving device 70a raises operated section 49a, and FIG. 7B is a view illustrating a state where first valve driving device 70a lowers operated section 49a. Second valve driving device 70b includes driving source 71 and driving force transmission mechanism 73, and the configurations thereof are the same as those of first valve driving device 70a, and thus the description thereof will be omitted. In addition, when spool valve 46 revolves and operated section 49a stops at first and second nozzle positions N1 and N2, each of operated sections 49a is gripped by lever engaging sections 78 of first and second valve driving devices 70a and 70b. Further, when spool valve 46 revolves and operated section 49a moves from first and second nozzle positions N1 and N2, operated section 49a comes out of lever engaging section 78 of first and second valve driving devices 70a and 70b.

In addition, driving source 71 of second valve driving device 70b is disposed on the side opposite to driving source 71 of first valve driving device 70a when viewed from multiple nozzles 44 in a direction (here, the Y-axis direction, that is, the front-rear direction) parallel to the horizontal plane (XY-plane) and orthogonal to the conveyance direction of board 12. In other words, driving sources 71 and 71 of first and second valve driving devices 70a and 70b are disposed on the sides opposite to each other so as to sandwich multiple nozzles 44 along the front-rear direction when viewed from above. In addition, in the present embodiment, the front-rear direction is also a direction parallel to the horizontal plane and orthogonal to the arrangement direction of component supply devices 20.

Pressure supply device 80 is a device for supplying at least negative pressure to multiple nozzles 44, and in the present embodiment, supplies negative pressure and positive pressure. In addition, whether pressure supply device 80 supplies any of negative pressure and positive pressure to each of multiple nozzles 44 is switched by spool valve 46 that corresponds to each of nozzles 44. As illustrated in FIG. 4, pressure supply device 80 includes positive pressure source 81*a*, a negative pressure source 81*b*, frame passages 82*a* and 82*b*, head passages 83*a* and 83*b*, positive pressure introduction passage 84*a*, negative pressure introduction passage 84*b*, positive pressure supply passage 87*a*, and negative pressure supply passage 87*b*.

Positive pressure source 81*a* is configured as a compressor, for example. Negative pressure source 81*b* is configured as a vacuum pump, for example. At least one of positive pressure source 81*a* and negative pressure source 81*b* may be disposed outside mounting head 40 or outside component mounter 10. Any of frame passages 82*a* and 82*b* is formed in frame 40*b* of mounting head 40, and is connected to positive pressure source 81*a* and negative pressure source 81*b*, respectively. Head passages 83*a* and 83*b* communicate with frame passages 82*a* and 82*b*, respectively, and are formed so as to extend along the central axis direction of R-axis 51 and head main body 41. In addition, as illustrated in FIGS. 4 and 6, head passage 83*a* is a columnar passage including the center axis of R-axis 51 and head main body 41. Head passage 83*b* is formed coaxially with head passage 83*a* as a cylindrical (the section thereof has a ring shape) passage that surrounds the periphery of head passage 83*a* while being separated from head passage 83*a*.

Multiple positive pressure introduction passages 84*a* communicate with head passages 83*a* and are formed so as to extend radially from the central axis of head main body 41 to the outer side in the radial direction (refer to FIG. 5). Each of multiple positive pressure introduction passages 84*a* is formed corresponding to each of multiple spool valves 46, extends linearly toward spool hole 41*b* into which corresponding spool valve 46 is inserted, and communicates with the inside of spool hole 41*b*. Each of multiple positive pressure introduction passages 84*a* is formed so as to avoid multiple nozzle holders 42 and multiple holder holes 41*a*. For example, positive pressure introduction passage 84*a* that extends from head passage 83*a* to the valve is disposed so as to pass between the B holder and the C holder when viewed from above.

Multiple negative pressure introduction passages 84*b* communicate with head passages 83*b* and are formed so as to extend radially from the center axis side of head main body 41 toward the outside. Each of multiple negative pressure introduction passages 84*b* is disposed corresponding to each of multiple spool valves 46, linearly extends toward spool hole 41*b* into which corresponding spool valve 46 is inserted, and communicates with the inside of spool hole 41*b*. Each of multiple negative pressure introduction passages 84*b* is positioned immediately above positive pressure introduction passage 84*a* that corresponds to same spool valve 46 (refer to FIG. 4), and is formed so as to avoid multiple nozzle holders 42 and multiple holder holes 41*a* similarly to positive pressure introduction passage 84*a*.

Multiple positive pressure supply passages 87*a* are formed on the inside of head main body 41 with each positive pressure supply passage 87*a* configured to correspond to one of the multiple spool valves 46. Each of multiple positive pressure supply passages 87*a* is formed so as to connect nozzle holder 42 and spool valve 46 corresponding to each other (for example, between the A holder and the a valve) (refer to FIG. 5), and establish communication between holder hole 41*a* and spool hole 41*b*.

Multiple negative pressure supply passages 87*b* are formed on the inside of head main body 41 with each negative pressure supply passages 87*b* configured to correspond to one of the multiple spool valves 46. Each of negative pressure supply passages 87*b* includes a passage that extends horizontally from corresponding spool valve 46 toward nozzle holder 42 that corresponds to spool valve 46 (refer to FIG. 6) and a passage that extends immediately downward from the passage to positive pressure supply passage 87*a* (refer to FIG. 7). A lower end of the passage that extends immediately below negative pressure supply passage 87*b* communicates with positive pressure supply passage 87*a*. In other words, negative pressure supply passage 87*b* merges with positive pressure supply passage 87*a* that extends from same spool hole 41*b* and communicates with holder hole 41*a* via positive pressure supply passage 87*a*.

The switching of the pressure supplied from valve driving device 70 to nozzle 44 will be described. As illustrated in FIG. 7A, in a state where spool valve 46 is at a raised position, spool valve 46 causes positive pressure introduction passage 84*a* and positive pressure supply passage 87*a* to communicate with each other via spool hole 41*b*. In addition, spool valve 46 blocks the communication between negative pressure introduction passage 84*b* and negative pressure supply passage 87*b* as large diameter section 47 defines the inside of spool hole 41*b*. Accordingly, the positive pressure from positive pressure source 81*a* is supplied into holder hole 41*a* via frame passage 82*a*, head passage 83*a*, positive pressure introduction passage 84*a*, spool hole 41*b*, and positive pressure supply passage 87*a*. In addition, the positive pressure in holder hole 41*a* is supplied into nozzle holder 42 through the hole formed on the side face of nozzle holder 42, and the positive pressure is supplied to the distal end of nozzle 44. Meanwhile, as illustrated in FIG. 7B, in a state where spool valve 46 is at a lowered position, spool valve 46 blocks the communication between positive pressure introduction passage 84*a* and positive pressure supply passage 87*a* as large diameter section 47 defines the inside of spool hole 41*b*. In addition, spool valve 46 causes negative pressure introduction passage 84*b* and negative pressure supply passage 87*b* to communicate with each other via spool hole 41*b*. Accordingly, the negative pressure from negative pressure source 81*b* is supplied into holder hole 41*a* via frame passage 82*b*, head passage 83*b*, negative pressure introduction passage 84*b*, spool hole 41*b*, negative pressure supply passage 87*b*, and positive pressure supply passage 87*a*. Therefore, the negative pressure is supplied to the distal end of nozzle 44. In this manner, when spool valve 46 is at the raised position, the positive pressure is supplied to nozzle 44 that corresponds to spool valve 46, and when spool valve 46 is at the lowered position, the negative pressure is supplied to corresponding nozzle 44.

As illustrated in FIG. 1, parts camera 28 is provided between component supply device 20 and board conveyance device 25. Parts camera 28 images the orientation of the components picked up by nozzle 44 from below.

As illustrated in FIG. 8, control device 90 is configured as a microprocessor centered on CPU 91 and includes ROM 92, HDD 93, RAM 94, input and output interface 95, and the like, in addition to CPU 91. These are connected to each other via bus 96. Detection signals from X-axis and Y-axis position sensors 37 and 39, R-axis position sensor 53, Q-axis position sensor 59, and Z-axis position sensors 65 and 65, image signals from parts camera 28, and the like are input into control device 90 via input and output interface 95. In addition, control signals and the like to component supply device 20, board conveyance device 25, X-axis and Y-axis motors 36 and 38, R-axis motor 52, Q-axis motor 58, Z-axis motors 64 and 64, driving sources 71 and 71, and parts camera 28 are output from control device 90 via input and output interface 95.

Next, the operation when component mounter 10 performs a production process will be described. CPU 91 of control device 90 controls each section of component mounter 10 based on the production programs received from a management device (not illustrated) to produce board 12 on which multiple components are mounted. In addition, at the start of the production process, it is assumed that all of multiple spool valves 46 are at the raised position. In the production process, CPU 91 first moves mounting head 40 above component supply device 20. Subsequently, CPU 91 performs a pickup process for subsequently picking up the components from each of multiple nozzles 44. In the pickup process, first, CPU 91 lowers nozzles 44 positioned at first and second nozzle positions N1 and N2, respectively. Further, CPU 91 operates operated section 49a positioned at first and second operation positions W1 and W2 to lower operation levers 49. Accordingly, the negative pressure is supplied to nozzles 44 positioned at first and second nozzle positions N1 and N2, and each of nozzles 44 picks up and holds the component supplied from component supply device 20. Then, CPU 91 raises nozzles 44 positioned at first and second nozzle positions N1 and N2. In addition, since first and second nozzle positions N1 and N2 are arranged in the same left-right direction as the arrangement direction of component supply devices 20, nozzles 44 positioned at first and second nozzle positions N1 and N2 can pick up the components at the same time. In this manner, CPU 91 causes all nozzles 44 to pick up components by alternately performing a process of causing nozzles 44 positioned at first and second nozzle positions N1 and N2 to pick up components and a process of changing nozzles 44 positioned at first and second nozzle positions N1 and N2 by R-axis driving device 50.

When the pick-up process is performed, CPU 91 moves mounting head 40 above parts camera 28 and subsequently images the components, picked up by each of nozzles 44, with parts camera 28. Then, the orientation of the component is recognized based on each captured image, and a mounting process of mounting the components onto board 12 is performed in consideration of the orientation. In the mounting process, CPU 91 first moves mounting head 40 such that the component held by nozzle 44 positioned at first nozzle position N1 is positioned above the mounting position on board 12. Next, CPU 91 rotates nozzle 44 positioned at first nozzle position N1 in an appropriate direction, in consideration of the orientation of the component based on the captured image of parts camera 28, and lowers nozzle 44. Subsequently, CPU 91 operates operated section 49a positioned at first operation position W1 to raise operation lever 49. Accordingly, the positive pressure is supplied to nozzle 44 positioned at first nozzle position N1, nozzle 44 separates the components, and the components are mounted on board 12. Then, CPU 91 raises nozzle 44 positioned at first nozzle position N1. CPU 91 mounts the components of all nozzles 44 onto board 12 by alternately performing the process of mounting the component held by nozzle 44 positioned at first nozzle position N1 onto board 12 and the process of changing nozzle 44 positioned at first nozzle position N1 by R-axis driving device 50. In addition, CPU 91 may perform the mounting process using nozzle 44 positioned at second nozzle position N2.

Here, the correspondence between the constituent elements of the present embodiment and the constituent elements of the present disclosure will be clarified. Mounting head 40 of the present embodiment corresponds to the mounting head of the present disclosure, XY robot 30 corresponds to the head moving device, board conveyance device 25 corresponds to the conveyance device, nozzle 44 corresponds to the nozzle, spool valve 46 corresponds to the switching valve, R-axis driving device 50 corresponds to the nozzle moving device, first valve driving device 70a corresponds to the first driving device, driving source 71 of first valve driving device 70a corresponds to the first driving source, second valve driving device 70b corresponds to the second driving device, and driving source 71 of second valve driving device 70b corresponds to the second driving source. In addition, component supply device 20 corresponds to the component supply device. Driving force transmission mechanism 73, linear moving section 76, and guide rail 79 of first valve driving device 70a correspond to the first driving force transmission mechanism, the first linear moving section, and the first support section, respectively. Driving force transmission mechanism 73, linear moving section 76, and guide rail 79 of second valve driving device 70b correspond to the second driving force transmission mechanism, the second linear moving section, and the second support section, respectively.

In an aspect of the example of component mounter 10 described in detail above, driving sources 71 and 71 of first and second valve driving devices 70a and 70b are disposed on the sides opposite to each other so as to sandwich multiple nozzles 44 along the direction (here, front-rear direction) parallel to the horizontal plane and orthogonal to the conveyance direction of board 12. Therefore, in component mounter 10, for example, compared to a case where driving sources 71 and 71 are disposed on the same side (for example, front part of nozzle 44) when viewed from multiple nozzles 44, it is possible to reduce the size of mounting head 40. In addition, driving sources 71 and 71 of first and second valve driving devices 70a and 70b are disposed on the sides opposite to each other so as to sandwich multiple nozzles 44 along the direction parallel to the horizontal plane and orthogonal to the arrangement direction of the multiple component supply devices.

Furthermore, in an aspect of the example of component mounter 10, multiple nozzles 44 are disposed on the circumference. In addition, each of multiple spool valves 46 is disposed at a position circumferentially deviated from the radial direction that goes through corresponding nozzle 44. Accordingly, multiple nozzles 44 and multiple spool valves 46 can be compactly disposed within a circular region having a smaller diameter while securing a supply path (here, negative pressure supply passage 87b) of the negative pressure from spool valve 46 to corresponding nozzle 44. As a result, the diameter of head main body 41 can be reduced. Therefore, it is possible to reduce the size of mounting head 40. In addition, in the present embodiment, by disposing spool valve 46 at a position circumferentially deviated from the radial direction that goes through corresponding nozzle 44 as described above, a supply path (here, positive pressure supply path 87a) of the positive pressure from spool valve 46 to corresponding nozzle 44 can also be secured.

Furthermore, in the aspect of the example of component mounter 10, multiple nozzles 44 are disposed on the circumference. In addition, R-axis driving device 50 integrally rotates multiple nozzles 44 and multiple spool valves 46. First valve driving device 70a includes driving force transmission mechanism 73 that transmits driving force from driving source 71 to first operation position W1 which is a position circumferentially deviated from first nozzle position N1 in the radial direction in which nozzle 44 is disposed. Second valve driving device 70b also includes driving force transmission mechanism 73 having the same configuration. Multiple operated sections 49a are disposed on the circumference concentric to multiple nozzles 44, and each of operated sections 49a is disposed at a position deviated from corresponding nozzle 44 in the radial direction of the circumference (circumference on which multiple nozzles 44 are disposed) so as to be positioned at first operation position W1 when corresponding nozzle 44 is positioned at first nozzle position N1 and to be positioned at the second operation position W2 when corresponding nozzle 44 is positioned at second nozzle position N2. Accordingly, in component mounter 10, first operation position W1 for operating spool valve 46 that corresponds to first nozzle position N1 can be disposed at a position different from the position along the radial direction with respect to first nozzle position N1. In other words, the degree of freedom in the arrangement of first operation position W1 increases. Accordingly, first operation position W1 can be easily determined such that driving force transmission mechanism 73 of first valve driving device 70a is disposed at a position that does not hinder the reduction of the size of mounting head 40, thereby making it easy to reduce the size of mounting head 40. Similarly, the second operation position W2 can be easily determined such that driving force transmission mechanism 73 of second valve driving device 70b is disposed at a position that does not hinder the reduction of the size of mounting head 40, thereby making it easy to reduce the size of mounting head 40. For example, as a comparative example, a case where the first operation position that corresponds to nozzle 44 (A nozzle) positioned at first nozzle position N1 in FIG. 5 is disposed at a position (intermediate position between operated section 49a of the k valve and operated section 49a of the l valve in FIG. 5) on outer side in the radial direction of the nozzle position N1 will be considered. In this case, it is necessary to dispose driving force transmission mechanism 73 of first valve driving device 70a so as to extend further to the lower right than FIG. 5, and an extra space for disposing driving force transmission mechanism 73 on the right side of head main body 41 is necessary compared to FIG. 5. Therefore, the size of mounting head 40 easily increases. Meanwhile, in component mounter 10 of the present embodiment, since first operation position W1 is disposed as illustrated in FIG. 5, when driving force transmission mechanism 73 of first valve driving device 70a is disposed in the region at the right rear part of head main body 41, driving force transmission mechanism 73 can be prevented from protruding as much as possible to the right side from the right end of head main body 41. Therefore, the space between the right end of head main body 41 and housing 40a can be reduced, thereby making it easy to reduce the size of mounting head 40. The same will be applied to the arrangement of driving force transmission mechanism 73 of second valve driving device 70b.

Furthermore, in the aspect of the example of component mounter 10, first valve driving device 70a includes driving force transmission mechanism 73 that transmits driving force from driving source 71 to spool valve 46 that corresponds to nozzle 44 positioned at first nozzle position N1. In addition, driving force transmission mechanism 73 includes linear moving section 76 that moves linearly based on driving force from driving source 71 and guide rail 79 that supports linear moving section 76 while allowing the linear movement. Second valve driving device 70b has the same configuration. Here, when the arrangement of driving source 71 and spool valve 46 is determined with priority given to the reduction of the size of mounting head 40, there is a case where the position (here, position of conversion mechanism 74) at which driving force from driving source 71 is received and the position (here, position of lever engaging section 78) at which the driving force is transmitted to spool valve 46 in driving force transmission mechanism 73 are separated from each other. For example, as a comparative example, a case is considered in which drive shaft 72 of driving source 71 is brought closer to operated section 49a compared to FIG. 5. In the comparative example, the distance between the position of conversion mechanism 74 and the position of lever engaging section 78 can be shortened by making linear moving section 76 smaller than that in FIG. 5. However, in a case where drive shaft 72 is brought closer to operated section 49a, in order to avoid the interference between driving source 71 and head main body 41, driving source 71 needs to be disposed at an orientation of being rotated from the state of FIG. 5. As a result, in the comparative example, driving source 71 easily becomes a state of not being accommodated in housing 40a illustrated in FIG. 5, thereby making it easy to reduce the size of mounting head 40. Meanwhile, in the present embodiment, driving source 71 is disposed in an orientation and position at which it is possible to reduce the size of housing 40a as much as possible and reduce the size of mounting head 40, and compared to the above-described comparative example, the position of conversion mechanism 74 and the position of lever engaging section 78 are separated from each other. In such a case, as guide rail 79 supports linear moving section 76, it is possible to stabilize the operation of driving force transmission mechanism 73. The same will be applied to guide rail 79 of second valve driving device 70b.

In addition, the present disclosure is not limited to any of the above-described embodiments, and it is needless to say that the present disclosure can be achieved in various forms as long as the technology belongs to the technical scope of the present disclosure.

For example, in the above-described embodiments, driving sources 71 and 71 of first and second valve driving devices 70a and 70b are disposed on the sides opposite to each other to sandwich multiple nozzles 44 along the direction orthogonal to the conveyance direction of board 12, but the present disclosure is not limited thereto. For example, driving sources 71 and 71 may be arranged in the left-right direction and disposed on the sides opposite to each other so as to sandwich multiple nozzles 44 along the conveyance direction of board 12. Even in this case, for example, compared to a case where driving sources 71 and 71 are disposed on the same side (for example, on the right side of nozzles 44) when viewed from multiple nozzles 44, it is possible to reduce the size of the mounting head. However, driving sources 71 and 71 may be disposed on the same side when viewed from multiple nozzles 44. For example, driving sources 71 and 71 may be disposed at the rear part (on the side near X-axis slider 32) of multiple nozzles 44.

In the above-described embodiments, the conveyance direction of board 12 and the arrangement direction of component supply device 20 are the left-right direction, but at least one of the directions may be different from the left-right direction.

In the above-described embodiments, each of multiple spool valves 46 is disposed at a position circumferentially deviated from the radial direction that goes through corresponding nozzle 44, but not being limited thereto, one or more of multiple spool valves 46 may be disposed at a circumferential position along the radial direction that goes through corresponding nozzle 44. In addition, even in a case where spool valve 46 is disposed at the position along the radial direction of the circumference with respect to corresponding nozzle 44, by adjusting the shape or the arrangement of operation lever 49, it is possible to dispose operated section 49*a* at the position deviated from corresponding nozzle 44 in the radial direction of the circumference.

According to this, similarly to the above-described embodiments, it is possible to dispose first and second operation positions W1 and W2 at positions deviated from first and second nozzle positions N1 and N2 in the radial direction.

In the above-described embodiments, all of multiple spool valves 46 are disposed on the outside of corresponding nozzles 44, but one or more of spool valves 46 may be disposed on the inside of corresponding nozzles 44. In addition, in the above-described embodiments, multiple spool valves 46 are disposed on the same circumference, but the present disclosure is not limited thereto. For example, spool valves 46 adjacent to each other may be alternately disposed on a circumference having a small diameter and a circumference having a large diameter. In addition, even in a case where not all of multiple spool valves 46 are disposed on the same circumference, it is preferable that multiple operated sections 49*a* are disposed on the same circumference.

In the above-described embodiments, first and second operation positions W1 and W2 are disposed at the position deviated from first and second nozzle positions N1 and N2 in the radial direction, but not being limited thereto, may be disposed at the position along the radial direction with respect to first and second nozzle positions N1 and N2.

In the above-described embodiments, each of first and second valve driving devices 70*a* and 70*b* includes driving force transmission mechanism 73 illustrated in FIG. 5, but any configuration may be used as long as driving force from driving source 71 can be transmitted to spool valve 46. In addition, first and second valve driving devices 70*a* and 70*b* are disposed to be rotationally symmetric (being 2-fold symmetry in the above-described embodiments), but for example, may be disposed to be left-right symmetric or front-rear symmetric, or need not be disposed symmetrically.

In the above-described embodiments, spool valve 46 switches the pressure supplied to corresponding nozzle 44, but not being limited to spool valve 46, other types of switching valves may switch the pressure supplied to corresponding nozzle 44.

In the above-described embodiments, spool valve 46 may be configured to block the communication between positive pressure introduction passage 84*a* and positive pressure supply passage 87*a* and to block the communication between negative pressure introduction passage 84*b* and negative pressure supply passage 87*b* when being positioned at the intermediate position between the raised position of FIG. 7A and the lowered position of FIG. 7B. In other words, spool valve 46 may be switchable to a state where neither the positive pressure nor the negative pressure is supplied to corresponding nozzle 44.

In the above-described embodiments, spool valve 46 and operated section 49*a* are deviated in the circumferential direction of head main body 41 by the angle $\theta$ (=45°) with respect to corresponding nozzle 44, but the present disclosure is not limited thereto. The angle $\theta$ may be 10° or greater, 20° or greater, or the like. In addition, spool valve 46 and operated section 49*a* are deviated by 1.5 nozzle pitches with respect to corresponding nozzle 44, but the deviation amount may be 1 nozzle pitch or greater, or may exceed 1 nozzle pitch. Further, the deviation amount may be 2 nozzle pitches or less, or may be less than 2 nozzle pitches. In addition, spool valve 46 and operated section 49*a* may differ from each other in the deviation amount (angle $\theta$) from the radial direction that goes through corresponding nozzle 44.

In the above-described embodiments, both Z-axis motors 64 and 64 are disposed at the rear part of the center of head main body 41 in the front-rear direction, but the disclosure is not limited thereto, and other arrangements may be used.

In the above-described embodiments, twelve nozzles 44 are arranged on the circumference at equal intervals, but the number of nozzles 44 is not limited to twelve and may be any plural number. For example, the number may be 8, 20, or 24.

In the above-described embodiments, the picking up and mounting of the components are performed at two nozzle positions (first and second nozzle positions N1 and N2), but the present disclosure is not limited thereto, and may be performed at two or more positions, such as three or four positions.

The component mounter of the present disclosure may be configured as follows.

According to the present disclosure, there is provided a second component mounter including: a mounting head configured to pick up components and mount the components onto a substrate, a head moving device configured to move the mounting head in parallel to a horizontal plane, and multiple component supply devices arranged in an arrangement direction parallel to the horizontal plane and configured to respectively supply the components; in which the mounting head includes multiple nozzles configured to pick up and hold the components by a negative pressure, multiple switching valves provided corresponding to each of the multiple nozzles and configured to switch whether the negative pressure is supplied to the corresponding nozzle, a nozzle moving device configured to change which nozzle is positioned at each of a first nozzle position and a second nozzle position for moving the multiple nozzles and performing at least one of picking up and mounting of the components, a first driving device having a first driving source and configured to switch the switching valve that corresponds to the nozzle positioned at the first nozzle position by a driving force from the first driving source, and a second driving device having a second driving source disposed on a side opposite to the first driving source when viewed from the multiple nozzles in a direction parallel to the horizontal plane and orthogonal to the arrangement direction, and configured to switch the switching valve that corresponds to the nozzle positioned at the second nozzle position by a driving force from the second driving source.

In the second component mounter, the first driving source and the second driving source are disposed on the sides opposite to each other so as to sandwich the multiple nozzles along the direction parallel to the horizontal plane and orthogonal to the arrangement direction of the multiple component supply devices. Therefore, in the second component mounter, for example, compared to a case where the first driving source and the second driving source are disposed on the same side when viewed from the multiple nozzles, it is possible to reduce the size of the mounting head.

According to the present disclosure, there is provided a third component mounter including: a mounting head configured to pick up components and mount the components onto a substrate, a head moving device configured to move the mounting head in parallel to a horizontal plane, and a conveyance device configured to convey the substrate in a conveyance direction parallel to the horizontal plane; in which the mounting head includes multiple nozzles configured to pick up and hold the components by a negative pressure, multiple switching valves provided corresponding to each of the multiple nozzles and configured to switch whether the negative pressure is supplied to the corresponding nozzle, a nozzle moving device configured to change which nozzle is positioned at each of a first nozzle position and a second nozzle position for moving the multiple nozzles and performing at least one of picking up and mounting of the components, a first driving device having a first driving source and configured to switch the switching valve that corresponds to the nozzle positioned at the first nozzle position by a driving force from the first driving source, and a second driving device having a second driving source disposed on a side opposite to the first driving source when viewed from the multiple nozzles in the conveyance direction or in a direction parallel to the horizontal plane and orthogonal to the conveyance direction and configured to switch the switching valve that corresponds to the nozzle positioned at the second nozzle position by a driving force from the second driving source.

In the third component mounter, the first driving source and the second driving source are disposed on the sides opposite to each other so as to sandwich the multiple nozzles along the conveyance direction, or are disposed on the sides opposite to each other so as to sandwich the multiple nozzles along the direction parallel to the horizontal plane and orthogonal to the conveyance direction of the substrate. Therefore, in the third component mounter, for example, compared to a case where the first driving source and the second driving source are disposed on the same side when viewed from the multiple nozzles, it is possible to reduce the size of the mounting head.

In the first to third component mounters of the present disclosure, the multiple nozzles may be disposed on the circumference, and each of the multiple switching valves may be disposed at a position circumferentially deviated from the radial direction that goes through the corresponding nozzle. In this manner, the multiple nozzles and the multiple switching valves can be compactly disposed within the circular region having a smaller diameter while securing the supply path of the negative pressure from the switching valve to the corresponding nozzle. Accordingly, it is possible to reduce the size of the mounting head.

In the first to third component mounters according to the present disclosure, the multiple nozzles may be disposed on a circumference, the nozzle moving device may integrally rotationally move the multiple nozzles and the multiple switching valves, the first driving device may have a first driving force transmission mechanism that transmits a driving force from the first driving source to a first operation position which is a position circumferentially deviated from radial direction that goes through the first nozzle position, the second driving device may have a second driving force transmission mechanism that transmits a driving force from the second driving source to a second operation position which is a position circumferentially deviated from the radial direction that goes through the second nozzle position, each of the multiple switching valves may have an operated section for receiving a driving force from the first driving force transmission mechanism and the second driving force transmission mechanism, and the multiple operated sections may be disposed on the circumference concentric to the multiple nozzles, and each of operated sections may be disposed at positions circumferentially deviated from the radial directions that go through the corresponding nozzles so as to be positioned at the first operation position when the corresponding nozzle is positioned at the first nozzle position and to be positioned at the second operation position when the corresponding nozzle is positioned at the second nozzle position. In the component mounter, the multiple nozzles are disposed on the circumference. In addition, the operated section of the switching valve is disposed at a position circumferentially deviated from the radial direction that goes through the nozzle that corresponds to the switching valve. Therefore, the first operation position for operating the switching valve that corresponds to the first nozzle position can be disposed at a position different from the position along the radial direction with respect to the first nozzle position. In other words, the degree of freedom of the arrangement of the first operation position increases. Accordingly, the first operation position can be easily determined such that the first driving force transmission mechanism is disposed at the position that does not hinder the reduction of the size of the mounting head, thereby easily reducing the size of the mounting head. Similarly, the second operation position can be easily determined such that the second driving force transmission mechanism is disposed at the position that does not hinder the reduction of the size of the mounting head, thereby making it easy to reduce the size of the mounting head.

In the first to third component mounters of the present disclosure, the first driving device may have a first driving force transmission mechanism that transmits a driving force from the first driving source to the switching valve that corresponds to the nozzle positioned at the first nozzle position, the first driving force transmission mechanism may have a first linear moving section that linearly moves based on a driving force from the first driving source and a first support section that supports the first linear moving section while allowing the linear movement, the second driving device may have a second driving force transmission mechanism that transmits a driving force from the second driving source to the switching valve that corresponds to the nozzle positioned at the second nozzle position, and the second driving force transmission mechanism may have a second linear moving section that linearly moves based on a driving force from the second driving source and a second support section that supports the second linear moving section while allowing the linear movement. Here, when the arrangement of the first driving source and the switching valve is determined with priority given to the reduction of the size of the mounting head, there is a case where the positions of both the first driving source and the switching valve are separated from each other, and the position at which the driving force from the first driving section is received and the position at which the driving force is transmitted to the switching valve in the first driving force transmission mechanism are separated from each other. In such a case, the operation of the first driving force transmission mechanism can be stabilized as the first support section supports the first linear moving section. Similarly, the operation of the second driving force transmission mechanism can be stabilized as the second support section supports the second linear moving section.

According to the present disclosure, there is provided a fourth component mounter including: a mounting head configured to pick up components and mount the components onto a substrate, and a head moving device configured to move the mounting head; in which the mounting head includes multiple nozzles that are disposed on a circumference and picks up and holds the components by a negative pressure, multiple switching valves provided corresponding to each of the multiple nozzles and configured to switch whether the negative pressure is supplied to the corresponding nozzle, a nozzle moving device configured to change which nozzle is positioned at a nozzle position for integrally rotationally moving the multiple nozzles and the multiple switching valves and performing at least one of picking up and mounting of the components, a driving source, and a driving force transmission mechanism that transmits a driving force from the driving source to an operation position which is a position circumferentially deviated from the radial direction that goes through the nozzle position; in which each of the multiple switching valves is configured to have an operated section for receiving a driving force from the driving force transmission mechanism and to switch whether the negative pressure is supplied to the nozzle by the driving force received by the operated section; and in which the multiple operated sections are disposed on the circumference concentric to the multiple nozzles and each of the operated sections is disposed at a position circumferentially deviated from the radial direction that goes through the corresponding nozzle so as to be positioned at the operation position when the corresponding nozzle is positioned at the nozzle position.

In the fourth component mounter, the multiple nozzles are disposed on the circumference. In addition, the operated section of the switching valve is disposed at a position circumferentially deviated from the radial direction that goes through the nozzle that corresponds to the switching valve. Therefore, the operation position for operating the switching valve that corresponds to the nozzle position can be disposed at a position different from the position along the radial direction with respect to the nozzle position. In other words, the degree of freedom in the arrangement of the operation position increases. Accordingly, the operation position can be easily determined such that the driving force transmission mechanism is disposed at the position that does not hinder the reduction of the size of the mounting head, thereby making it easy to reduce the size of the mounting head. In addition, in the fourth component mounter, various modes of the first to third component mounters described above may be adopted, or configurations of the first to third component mounters may be added.

According to the present disclosure, there is provided a fifth component mounter including: a mounting head configured to pick up components and mount the components onto a substrate, and a head moving device configured to move the mounting head; in which the mounting head includes multiple nozzles configured to pick up and hold the components by a negative pressure, multiple switching valves provided corresponding to each of the multiple nozzles and configured to switch whether the negative pressure is supplied to the corresponding nozzle, a nozzle moving device configured to change which nozzle is positioned at a nozzle position for moving the multiple nozzles and performing at least one of picking up and mounting of the components, and a driving device having a driving source and a driving force transmission mechanism that transmits a driving force from the driving source to the switching valve that corresponds to the nozzle positioned at the nozzle position, and switches the switching valve; and in which the driving force transmission mechanism includes a linear moving section that linearly moves based on the driving force from the driving source and a support section that supports the linear moving section while allowing the linear movement.

In the fifth component mounter, the driving force transmission mechanism of the driving device of the mounting head includes the linear moving section and the support section that supports the linear moving section. Here, when the arrangement of the driving source and the switching valve is determined with priority given to the reduction of the size of the mounting head, there is a case where the positions of both the driving source and the switching valve are separated from each other, and the position at which the driving force from the driving section is received and the position at which the driving force is transmitted to the switching valve in the driving force transmission mechanism are separated from each other. In such a case, the operation of the driving force transmission mechanism can be stabilized as the support section supports the linear moving section. In addition, in the fifth component mounter, various modes of the first to fourth component mounters described above may be adopted, or configurations of the first to fourth component mounters may be added.

INDUSTRIAL APPLICABILITY

The present disclosure can be applied to various industries where components are mounted on substrates, such as boards.

REFERENCE SIGNS LIST

10 component mounter, 11 base, 12 board, 20 component supply device, 25 board conveyance device, 26 conveyor belt, 27 support pin, 28 parts camera, 30 XY robot, 31 X-axis guide rail, 32 X-axis slider, 33 Y-axis guide rail, 34 Y-axis slider, 36 X-axis motor, 37 X-axis position sensor, 38 Y-axis motor, 39 Y-axis position sensor, 40 mounting head, 40a housing, 40b frame, 41 head main body, 41a holder hole, 41b spool hole, 42 nozzle holder, 42a engagement piece, 44 nozzle, 46 spool valve, 47 large diameter section, 49 operation lever, 49a operated section, 50 R-axis driving device, 51 R-axis, 52 R-axis motor, 53 R-axis position sensor, 54 Q-axis driving device, 55 Q-axis gear, 56 Q-axis gear, 57a, 57b gear, 58 Q-axis motor, 59 Q-axis position sensor, 60 Z-axis driving device, 60a, 60b first and second Z-axis driving device, 61 Z-axis moving body, 62 gripping section, 63 ball screw, 64 Z-axis motor, 65 Z-axis position sensor, 70 valve driving device, 70a, 70b first and second valve driving device, 71 driving source, 72 drive shaft, 73 driving force transmission mechanism, 74 conversion mechanism, 75 protruding section, 76 linear moving section, 77 protruding engaging section, 78 lever engaging section, 79 guide rail, 80 pressure supply device, 81a positive pressure source, 81b negative pressure source, 82a, 82b frame passage, 83a, 83b head passage, 84a positive pressure introduction passage, 84b negative pressure introduction passage, 87a positive pressure supply passage, 87b negative pressure supply passage, 90 control device, 91 CPU, 92 ROM, 93 HDD, 94 RAM, 95 input and output interface, 96 bus, N1, N2 first and second nozzle positions, W1, W2 first and second operation positions

The invention claimed is:

1. A component mounter comprising:
a mounting head configured to pick up components and mount the components onto a substrate,
a head moving device configured to move the mounting head in parallel to a horizontal plane, and
a conveyance device configured to convey the substrate in a conveyance direction parallel to the horizontal plane;
wherein the mounting head includes
multiple nozzles configured to pick up and hold the components by a negative pressure,
multiple switching valves provided corresponding to each of the multiple nozzles and configured to switch whether the negative pressure is supplied to the corresponding nozzle,
a nozzle moving device configured to change which nozzle is positioned at each of a first nozzle position and a second nozzle position for moving the multiple nozzles and performing at least one of picking up and mounting of the components,
a first driving device having a first driving source and configured to switch the switching valve that corresponds to the nozzle positioned at the first nozzle position by a driving force from the first driving source, and
a second driving device having a second driving source disposed on a side opposite to the first driving source when viewed from the multiple nozzles in a direction parallel to the horizontal plane and orthogonal to the conveyance direction, and configured to switch the switching valve that corresponds to the nozzle positioned at the second nozzle position by a driving force from the second driving source.

2. The component mounter according to claim 1,
wherein the multiple nozzles are disposed on a circumference; and
wherein each of the multiple switching valves is disposed at a position circumferentially deviated from the radial direction that goes through the corresponding nozzle.

3. The component mounter according to claim 1,
wherein the multiple nozzles are disposed on a circumference;
wherein the nozzle moving device integrally rotationally moves the multiple nozzles and the multiple switching valves;
wherein the first driving device has a first driving force transmission mechanism that transmits a driving force from the first driving source to a first operation position which is a position circumferentially deviated from a radial direction that goes through the first nozzle position;
wherein the second driving device has a second driving force transmission mechanism that transmits a driving force from the second driving source to a second operation position which is a position circumferentially deviated from a radial direction that goes through the second nozzle position;
wherein each of the multiple switching valves has an operated section for receiving a driving force from the first driving force transmission mechanism and the second driving force transmission mechanism; and
wherein the multiple operated sections are disposed on the circumference concentric to the multiple nozzles, and each of operated sections is disposed at positions circumferentially deviated from the radial directions that go through the corresponding nozzles so as to be positioned at the first operation position when the corresponding nozzle is positioned at the first nozzle position and to be positioned at the second operation position when the corresponding nozzle is positioned at the second nozzle position.

4. The component mounter according to claim 1,
wherein the first driving device has a first driving force transmission mechanism that transmits a driving force from the first driving source to the switching valve that corresponds to the nozzle positioned at the first nozzle position;
wherein the first driving force transmission mechanism has a first linear moving section that linearly moves based on a driving force from the first driving source and a first support section that supports the first linear moving section while allowing the linear movement;
wherein the second driving device has a second driving force transmission mechanism that transmits a driving force from the second driving source to the switching valve that corresponds to the nozzle positioned at the second nozzle position; and
wherein the second driving force transmission mechanism has a second linear moving section that linearly moves based on a driving force from the second driving source and a second support section that supports the second linear moving section while allowing the linear movement.

5. A component mounter comprising:
a mounting head configured to pick up components and mount the components onto a substrate,
a head moving device configured to move the mounting head in parallel to a horizontal plane, and
multiple component supply devices arranged in an arrangement direction parallel to the horizontal plane and configured to respectively supply the components;
wherein the mounting head includes
multiple nozzles configured to pick up and hold the components by a negative pressure,
multiple switching valves provided corresponding to each of the multiple nozzles and configured to switch whether the negative pressure is supplied to the corresponding nozzle,
a nozzle moving device configured to change which nozzle is positioned at each of a first nozzle position and a second nozzle position for moving the multiple nozzles and performing at least one of picking up and mounting of the components,
a first driving device having a first driving source and configured to switch the switching valve that corresponds to the nozzle positioned at the first nozzle position by a driving force from the first driving source, and
a second driving device having a second driving source disposed on a side opposite to the first driving source when viewed from the multiple nozzles in a direction parallel to the horizontal plane and orthogonal to the arrangement direction, and configured to switch the switching valve that corresponds to the nozzle positioned at the second nozzle position by a driving force from the second driving source.

6. A component mounter comprising:
a mounting head configured to pick up components and mount the components onto a substrate,
a head moving device configured to move the mounting head in parallel to a horizontal plane, and
a conveyance device configured to convey the substrate in a conveyance direction parallel to the horizontal plane;

wherein the mounting head includes
multiple nozzles configured to pick up and hold the components by a negative pressure,
multiple switching valves provided corresponding to each of the multiple nozzles and configured to switch whether the negative pressure is supplied to the corresponding nozzle,
a nozzle moving device configured to change which nozzle is positioned at each of a first nozzle position and a second nozzle position for moving the multiple nozzles and performing at least one of picking up and mounting of the components,
a first driving device having a first driving source and configured to switch the switching valve that corresponds to the nozzle positioned at the first nozzle position by a driving force from the first driving source, and
a second driving device having a second driving source disposed on a side opposite to the first driving source when viewed from the multiple nozzles in the conveyance direction or in a direction parallel to the horizontal plane and orthogonal to the conveyance direction, and configured to switch the switching valve that corresponds to the nozzle positioned at the second nozzle position by a driving force from the second driving source.

* * * * *